(12) United States Patent
Iba et al.

(10) Patent No.: US 9,074,126 B2
(45) Date of Patent: Jul. 7, 2015

(54) CERAMIC COMPOSITE FOR LIGHT CONVERSION

(75) Inventors: Hisayoshi Iba, Ube (JP); Shinichi Ishitobi, Ube (JP); Yasuyuki Ichizono, Ube (JP)

(73) Assignee: Ube Industries, Ltd., Ube-shi (JP)

( * ) Notice: Subject to any disclaimer, the term of this patent is extended or adjusted under 35 U.S.C. 154(b) by 0 days.

(21) Appl. No.: 13/993,931

(22) PCT Filed: Dec. 13, 2011

(86) PCT No.: PCT/JP2011/078753
§ 371 (c)(1),
(2), (4) Date: Aug. 26, 2013

(87) PCT Pub. No.: WO2012/081566
PCT Pub. Date: Jun. 21, 2012

(65) Prior Publication Data
US 2013/0328095 A1 Dec. 12, 2013

(30) Foreign Application Priority Data
Dec. 16, 2010 (JP) ................................. 2010-280562

(51) Int. Cl.
*H01L 33/00* (2010.01)
*C09K 11/02* (2006.01)
(Continued)

(52) U.S. Cl.
CPC ............. *C09K 11/025* (2013.01); *C04B 35/117* (2013.01); *C04B 35/44* (2013.01);
(Continued)

(58) Field of Classification Search
CPC ............................. H01L 33/00; H01L 33/502
USPC ...................................... 257/98, 301; 438/301
See application file for complete search history.

(56) References Cited

U.S. PATENT DOCUMENTS

| 5,484,752 A | 1/1996 | Waku et al. |
| 5,569,547 A | 10/1996 | Waku et al. |

(Continued)

FOREIGN PATENT DOCUMENTS

| CN | 1879229 A | 12/2006 |
| CN | 101376522 A | 3/2009 |

(Continued)

OTHER PUBLICATIONS

Pan et al., "Tailored photoluminescence of YAG:Ce phosphor through various method", Journal of Physics and Chemistry of Solids, 2004, pp. 845-850, vol. 65.

(Continued)

*Primary Examiner* — Phuc Dang
(74) *Attorney, Agent, or Firm* — The Webb Law Firm

(57) ABSTRACT

A ceramic composite for light conversion, and method of producing same and a light emitting device including the same. The ceramic composite for light conversion of the present invention is a solidified body having a structure in which at least two oxide phases including a first phase and a second phase are continuously and three-dimensionally intertwined with one another, and characterized in that the first phase is a $Y_3Al_5O_{12}$ phase including Ba or Sr and activated with fluorescent Ce, the second phase is an $Al_2O_3$ phase, and the Sr or Ba in the solidified body are contained in an amount of 0.01 to 1.00 part by mass based on 100 parts by mass of the solidified body, in terms of the oxide.

9 Claims, 3 Drawing Sheets

(51) Int. Cl.
    *C04B 35/117*     (2006.01)
    *C04B 35/44*     (2006.01)
    *C04B 35/65*     (2006.01)
    *C09K 11/77*     (2006.01)
    *H01L 33/50*     (2010.01)

(52) U.S. Cl.
CPC ...... *C04B 35/652* (2013.01); *C04B 2235/3208* (2013.01); *C04B 2235/3213* (2013.01); *C04B 2235/3215* (2013.01); *C04B 2235/3217* (2013.01); *C04B 2235/3222* (2013.01); *C04B 2235/3225* (2013.01); *C04B 2235/3229* (2013.01); *C04B 2235/442* (2013.01); *C04B 2235/444* (2013.01); *C04B 2235/445* (2013.01); *C04B 2235/6581* (2013.01); *C04B 2235/764* (2013.01); *C04B 2235/80* (2013.01); *C09K 11/7774* (2013.01); *H01L 33/501* (2013.01); *H01L 33/502* (2013.01)

(56) References Cited

U.S. PATENT DOCUMENTS

| | | | |
|---|---|---|---|
| 5,902,963 | A | 5/1999 | Chappaz et al. |
| 2004/0173807 | A1 | 9/2004 | Tian et al. |
| 2006/0250069 | A1 | 11/2006 | Sakata et al. |
| 2011/0117360 | A1* | 5/2011 | Izumi et al. ............ 428/329 |
| 2012/0025223 | A1* | 2/2012 | Low et al. ............ 257/89 |
| 2012/0045634 | A1* | 2/2012 | Irie et al. ............ 428/220 |
| 2012/0100551 | A1* | 4/2012 | Kojima et al. ............ 435/6.12 |

FOREIGN PATENT DOCUMENTS

| | | |
|---|---|---|
| CN | 101503622 A | 8/2009 |
| JP | 7149597 A | 6/1995 |
| JP | 7187893 A | 7/1995 |
| JP | 881257 A | 3/1996 |
| JP | 8253389 A | 10/1996 |
| JP | 8253390 A | 10/1996 |
| JP | 967194 A | 3/1997 |
| JP | 2000208815 A | 7/2000 |
| JP | 2004146835 A | 5/2004 |
| JP | 2008533270 A | 8/2008 |
| WO | 2004065324 A1 | 8/2004 |
| WO | 2006043719 A1 | 4/2006 |
| WO | 2006064930 A1 | 6/2006 |
| WO | 2007083828 A1 | 7/2007 |

OTHER PUBLICATIONS

Ichikawa et al., "The Present State and the Future of White LED Using Rare Earth Phosphor", Material Integration, 2003, pp. 41-46, vol. 16, No. 7.

Bando et al., "GaN light emitting diode for general illumination", Japanese Journal of Applied Physics, 2002, pp. 1518-1522, vol. 71, No. 12.

Holloway et al., "Optical Properties of Cerium-Activated Garnet Crystals", Journal of the Optical Society of America, Jan. 1969, pp. 60-63, vol. 59, No. 1.

Kottaisamy et al., "Color tuning of Y3Al5O12: Ce phosphor and their blend for white LEDs", Materials Research Bulletin, 2008, pp. 1657-1663, vol. 43.

* cited by examiner

CERAMIC COMPOSITE FOR LIGHT CONVERSION

TECHNICAL FIELD

The present invention relates to a ceramic composite for light conversion, which is used in a light emitting device such as a light emitting diode utilized in displays, lightings or back light sources; a method for producing the same; and a light emitting device including the same.

BACKGROUND ART

Recently, development research has been actively performed on white light emitting devices utilizing a blue light emitting element as a light emitting source. In particular, the white light emitting diodes using a blue light emitting diode element are light in weight, use no mercury, and are long in lifetime, and thus the rapid expansion of the demand can be expected in the future. It is to be noted that a light emitting device using a light emitting diode element as a light emitting element is referred to as a "light emitting diode." A method, which is the most commonly adopted, for converting blue light from a blue light emitting diode element to white light is a method in which yellow, which is a complementary color of blue, is mixed with blue light from the blue light emitting diode element to obtain pseudo white. As described in, for example, Patent Literature 1, a coating layer including a fluorescent substance, which absorbs a part of blue light to emit yellow light, is provided on the whole surface of a diode element, which emits blue light, and a mold layer, which mixes blue light from the light source with the yellow light from the fluorescent substance, is provided ahead, whereby a white light emitting diode can be configured. As the fluorescent substance, YAG ($Y_3Al_5O_{12}$) powder activated by cerium (hereinafter referred to as "YAG:Ce") or the like is used.

In the structure of the white light emitting diode typified by the device disclosed in Patent Literature 1, which are commonly used now, however, the fluorescent substance powder is mixed with a resin such as epoxy and coated, and thus it is difficult to ensure the homogeneity in the mixed state of the fluorescent substance powder and the resin and to control the stabilization of the thickness of a coating film, and the like, and it is pointed out that color unevenness or variance of the white light emitting diode easily occurs. In addition, the resin to be mixed with the fluorescent substance powder has an inferior heat resistance to those of metals and ceramics, and thus the transmittance is easily reduced due to the deterioration caused by heat from the light emitting element. Accordingly, this is a bottleneck for increasing the output of the white light emitting diode, which is required now.

The present inventors have proposed from before a ceramic composite for light conversion including a solidified body in which multiple oxide phases containing a YAG:Ce fluorescent substance phase and an $Al_2O_3$ phase are continuously and three-dimensionally intertwined with one another, and a white light emitting device configured with a blue light emitting element and the ceramic composite for light conversion (Patent Literature 2). In the ceramic. composite for light conversion described above, the YAG:Ce fluorescent substance phase is distributed homogeneously, and thus homogeneous yellow fluorescence can be stably obtained, and the heat resistance is excellent because of being a ceramic. In addition, because it itself is a bulk body, it is not necessary to use a resin for configuring the white light emitting device, unlike the device disclosed in Patent Literature 1. The white light emitting device, thus, has a small color unevenness or variance, and is extremely preferable for increasing the output.

In a white light emitting device using a blue light emitting diode element and a YAG:Ce fluorescent substance, light from blue light emitting diode element, which is commonly used now, has a peak wavelength around 460 nm for blue (for example, CIE 1391 chromaticity coordinates (hereinafter referred to as "chromaticity coordinates") Cx=0.135, Cy=0.08). This is because the luminous efficiency of the YAG:Ce fluorescent substance is increased in this wavelength area. Incidentally, the color of a YAG:Ce fluorescent substance whose emission wavelength is not adjusted (hereinafter referred to as "unadjusted YAG:Ce") is yellow having a peak wavelength around 530 to 545 nm (for example, chromaticity coordinates Cx=0.41, Cy=0.56).

As for the white light emitting diode, the chromaticity range (color temperature) to be required varies depending on uses such as a display, a lighting or a backlight source, and thus it is necessary to select the fluorescent substance used according to the use. In order to stabilize the chromaticity of LED, it is more desirable to use one kind of fluorescent substance than simultaneous use of multiple fluorescent substances. It is essential, accordingly, to set the fluorescence dominant wavelength within a desired range as a standard of an emission wavelength in the YAG:Ce fluorescent substance having a broad fluorescence spectrum. In usual, the emission wavelength is adjusted by moving a peak wavelength of a fluorescent substance material to a long wavelength side or a short wavelength side.

As for a YAG:Ce fluorescent substance, it is known as prior art that the increased or decreased content of Ce as an activator can shift the peak of the fluorescence wavelength (Non-Patent Literature 1). Thus, the peak of the fluorescence wavelength of the YAG:Ce fluorescent substance can be moved by around 10 nm.

In addition, as for a YAG:Ce fluorescent substance, it is known as prior art that, for example, partial substitution of the Y element by a Gd element can shift the peak of the fluorescence wavelength to the longer wavelength side (Non-Patent Literatures 2 and 3). Patent Literature 2 proposes that a YAG:Ce fluorescent substance having a fluorescence wavelength thus adjusted to the longer wavelength side is combined with a blue light emitting diode element to configure a white light emitting diode, thereby obtaining white (chromaticity coordinates Cx=0.33, Cy=0.33).

In general, however, it is known that when the known substituent element is used in order to adjust the wavelength of the YAG:Ce fluorescent substance, the fluorescence intensity is usually reduced to less than half (Non-Patent Literatures 4 and 5).

In the ceramic composite for light conversion as described in Patent Literature 2, the present inventors also demonstrate that the adjustment of the composition of the entire solidified body can adjust the peak of the fluorescence wavelength in the range of 550 to 560 nm or 540 to 580 nm (Patent Literature 3).

CITATION LIST

Patent Literatures

Patent Literature 1: JP 2000-208815 A
Patent Literature 2: WO 2004/065324 A
Patent Literature 3: WO 2007/083828 A
Non-Patent Literatures
Non-Patent Literature 1: J. Physics and Chemistry of Solids, vol. 65 (2004) p. 845-850

Non-Patent Literature 2: Material Integration, vol. 16, No. 7, (2003) p. 41-46

Non-Patent Literature 3: Japanese Journal of Applied Physics, vol. 71, No. 12 (2002) p. 1518-1522

Non-Patent Literature 4: J. Optical Society of America, vol. 59 (1969) p 60

Non-Patent Literature 5: Material Research Bullein vol. 43 (2008) p. 1657-1663

SUMMARY OF INVENTION

Technical Problem

As described above, the ceramic composite for light conversion obtained by the unidirectional solidification process, which is described in Patent Literature 3, has excellent properties such as excellent heat resistance, ultraviolet resistance, and heat conductivity higher than those of resin dispersions since it does not use a resin. However, it has been found a problem in which when the fluorescence wavelength is adjusted by controlling the Ce content to set the wavelength to a specific range, variance may occur in fluorescent dominant wavelength depending on the position of the solidification direction during the production. In white light emitting device using the ceramic composite for light conversion, accordingly, there is a problem of increased color unevenness or variance.

At the same time, when the Ce content is increased in order to improve the fluorescence intensity of the ceramic composite for light conversion, the fluorescence wavelength is changed, and thus resulting in a problem in which the fluorescence intensity cannot be improved without change of the desired fluorescent dominant wavelength.

In addition, if the fluorescence wavelength is intended to be kept by substitution by the known element, the fluorescence intensity of the fluorescent substance is reduced, and thus resulting in a problem in which the desired fluorescence properties cannot be obtained.

It is an object of the present invention aims to provide a ceramic composite for light conversion, which has a fluorescence wavelength within a specific range, a small variance in the fluorescence dominant wavelength depending on the position of a solidified body in unidirectional solidification, and a high fluorescence intensity; a method for producing the same; and a light emitting device including the same.

Solution to Problem

In order to achieve the object described above, the present inventors have repeated a painstaking study. As a result, they have found that when an oxide of Sr or Ba, or an Sr compound or Ba compound capable of changing to an oxide during production step is added to a starting composition and the unidirectional solidification is subjected to the mixed starting material to include the Sr or Ba in the solidified body, a ceramic composite for light conversion, which has a small variance in the fluorescence dominant wavelength due to the position of a solidified body, and can keep a high fluorescence strength within a specific range of a fluorescence wavelength, is obtained, and have reached the present invention.

According to the present invention there is provided a ceramic composite for light conversion, which is a solidified body and comprises at least two oxide phases including a first phase and a second phase which are continuously and three-dimensionally intertwined with one another, the first phase containing Ba or Sr, and being a $Y_3Al_5O_{12}$ phase activated with fluorescent Ce, the second phase being an $Al_2O_3$ phase, and the Sr or Ba in the solidified body being contained in an amount of 0.01 to 1.00 part by mass based on 100 parts by mass of the solidified body, in terms of the oxide.

In the ceramic composite for light conversion of the present invention, it is preferable that the content of the cerium in the solidified body, when expressed it by Ce/(Y+Ce), is that the Ce/(Y+Ce) is less than 0.04 (however, except for Ce/(Y+Ce)= 0).

The present invention also provides a light emitting device including a light emitting element and the ceramic composite for light conversion described above.

The present invention further provides a method of producing a ceramic fluorescent substance for light conversion including steps of: melting a starting mixture including an Sr compound or a Ba compound, which exists as an oxide during the production, in an amount of 0.01 to 1.00 part by mass based on 100 parts by mass of a mixture of $Al_2O_3$, $Y_2O_3$ and $CeO_2$, in terms of the oxide, and then solidifying the molten mixture by an unidirectional solidification process.

Advantageous Effects of Invention

As described above, according to the present invention, there can be provided a ceramic composite for light conversion having a fluorescence wavelength within a specific range, a small variance in the fluorescence dominant wavelength due to the position of a solidified body in unidirectional solidification, and a high fluorescence intensity; a method for producing the same; and a light emitting device including the same.

DESCRIPTION OF EMBODIMENTS

The present invention will be explained in detail below.
[Ceramic Composite for Light Conversion]

Figure 2:
FIG. 2 is a micrograph of a cross section of a ceramic composite for light conversion according to Example 1.

The ceramic composite for light conversion according to the present invention is a solidified body having a structure in which at least two oxide phases including a first phase and a second phase are continuously and three-dimensionally intertwined with one another. The "structure in which at least two oxide phases are continuously and three-dimensionally intertwined with one another" refers to a structure in which oxide phases are present in direct contact with each other without any boundary phase such as amorphous between the respective phases, as shown in FIG. 2. In the ceramic composite for light conversion according to the present invention, the first phase contains Ba or Sr, which is a $Y_3Al_5O_{12}$ phase activated with fluorescent Ce; the second phase is an $Al_2O_3$ phase; and the Sr or Ba in the solidified body is contained in an amount of 0.01 to 1.00 part by mass based on 100 parts by mass of the solidified body, in terms of the oxide. As for the "100 parts by mass of the solidified body," a solidified body containing no Sr or Ba oxide is used as the base.

When the Sr or Ba in the solidified body is contained in an amount of 0.01 to 1.00 part by mass based on 100 parts by mass of the solidified body, in terms of the oxide, a ceramic composite for light conversion can be obtained, which has a small variance in the fluorescence dominant wavelength depending on the position of a solidified body, and can keep a high fluorescence strength within a specific range of a fluorescence wavelength. When the amount of the Sr or Ba is more than 1.00 part by mass in terms of the oxide, the majority of the second phase turns into an $SrAl_{12}O_{19}$ phase or $BaAl_{12}O_{19}$ phase from the $Al_2O_3$ phase. In addition, cracks are easily generated in the solidified body. When the amount of the Sr or Ba is less than 0.01 parts by mass in terms of the oxide, the variation range of the fluorescence dominant wavelength depending on the position of the solidified body, caused by absorbing light having a peak at a wavelength of 420 to 500 nm, spread to a similar extent to the case of an unadjusted YAG:Ce, and thus the effect of stabilizing the fluorescence wavelength by the addition cannot be exerted.

In the present invention, Sr or Ba exists in the first phase (YAG:Ce fluorescent substance phase). The presence of the Sr or Ba in the first phase is confirmed by an elementary analysis using an electron emission type scanning electron microscope. The stabilization of the fluorescence dominant wavelength in the ceramic composite for light conversion according to the present invention can be considered as follows:

In a conventional ceramic composite for light conversion, it can be considered that change of fluorescence wavelength due to an increased amount of Ce is caused by the mechanism in which Ce atoms exist heterogeneously in the first phase, and reabsorption and reemission of the fluorescence occur at the segregation part, whereby the fluorescence wavelength is shifted to a long wavelength side. It can be considered that the variance in the fluorescence dominant wavelength depending on the position of the solidified body results from a different segregation state of Ce in the first phase depending on the position of the solidified body.

According to the present invention, the Ce segregation, which makes the wavelength longer, is suppressed by the presence of an appropriate amount of Sr or Ba in the first phase, and the fluorescence reabsorption and reemission caused by Ce is suppressed by the homogeneous dispersion of Ce in the first phase. It can be considered, therefore, that an amount of emission of light on the long wavelength side in the fluorescence spectrum is not changed depending on the Ce concentration or the thickness of a ceramic composite for light conversion, the fluorescence wavelength is stabilized, and the variance in the fluorescence dominant wavelength depending on the position of the solidified body is decreased.

In the ceramic composite for light conversion of the present invention, it is preferable that the content of the cerium in the solidified body, when expressed it by Ce/(Y+Ce), is that the Ce/(Y+Ce) is less than 0.04 (excluding 0).

When the Ce/(Y+Ce) is within the range of less than 0.04 (excluding 0), it is possible to adjust the fluorescence intensity using the fluorescence wavelength within a specific range. When the Ce/(Y+Ce) is 0, the first phase in the ceramic composite does not act as the fluorescent substance phase, because of absence of fluorescent activating element. When the Ce/(Y+Ce) is 0.04 or more, a proportion of yellow fluorescence to blue is too large, and thus it is necessary to reduce the thickness of the ceramic composite for light conversion such as 0.1 mm or less for obtaining a preferable pseudo white light. In such a case, the thickness range of the ceramic composite is too small when the color tone is controlled, and thus it is undesirably difficult to adjust the color tone of the light emitting device. When the Ce/(Y+Ce) is too large, a volume proportion of complex oxide phases other than the first phase and the second phase such as a $CeAlO_3$ phase and $CeAl_{11}O_{18}$ phase is increased, and thus the fluorescence intensity may not sometimes be improved even if the a Ce amount is increased.

The amount of the Ce/(Y+Ce), and the amount of Sr or Ba, in terms of the oxide, can be obtained by a method described below. After the pulverized ceramic composite for light conversion according to the present invention is heat-molten in sodium carbonate and boric acid, hydrochloric acid and sulfuric acid are added thereto, and the resulting mixture is dissolved by heating. The obtained product is subjected to an inductively coupled plasma-atomic emission spectroscopy (ICP-AES) to obtain relative masses of Al, Y, Sr, Ba and Ce. The amount of the Ce/(Y+Ce) and the amount of Sr or Ba, in terms of the oxide, is calculated from those results.

Oxide phases other than the first phase and the second phase may sometimes exist in a range in which the fluorescence property is not influenced, though the amount thereof is very small. The oxide phase other than the first phase and the second phase may include, generally, complex oxide phases such as a $CeAlO_3$ phase, a $CeAl_{11}O_{18}$ phase, an $SrAl_{12}O_{19}$ phase, a $BaAl_{12}O_{19}$ phase, a $BaAl_{9.2}O_{14.8}$ phase and a (Y, Ce)$AlO_3$ phase.

As the solidified body of the present invention is a multi-component system containing multiple elements, the volume ratio of the first phase and the second phase is not consistent with a volume ratio in a known $Al_2O_3$—$Y_2O_3$ binary system, and varies depending on the kind and the amount of other elements contained. In addition, since the production amounts of the complex oxide phases vary according to a production method described below, the composition does not make the volume ratio of the first phase and the second phase constant. It is possible to obtain the ceramic composite for light conversion according to the present invention, if it is within a range of the starting composition ratio in which the first phase and the second phase coexist after the production.

The ceramic composite for light conversion according to the present invention can effectively emit fluorescence having a dominant wavelength at 560 to 570 nm by absorbing light (excitation light) having a peak at a wavelength of 420 to 500 nm, whereby yellow fluorescence can be effectively obtained. Even if the excitation light has a wavelength of 400 to 419 nm or a wavelength of 501 to 530 nm, the ceramic composite for light conversion according to the present invention can emit fluorescence, though the efficiency is reduced. Further, even if the excitation light is near-ultraviolet light having a wavelength of 300 to 360 nm, the ceramic composite for light conversion according to the present invention can emit fluorescence. The fluorescence dominant wavelength can be measured by solid quantum efficiency measuring apparatus in which an integrating sphere is combined with FP 6500, manufactured by JASCO Corporation.

The fluorescence peak wavelength emitted from the ceramic composite for light conversion is generally shifted to the longer wavelength side, as the Ce-substitution amount is increased at the Y site of the first phase (YAG:Ce). In the ceramic composite for light conversion according to the present invention, however, the fluorescence dominant wavelength emitted from the ceramic composite for light conversion is scarcely changed in the scope of the present invention by these effects, due to the inclusion of the Sr or Ba, and is maintained in a certain wavelength range. As for the Ce substitution amount, the Ce content in the first phase can be adjusted by changing a molar fraction of a $CeO_2$ starting material added.

The ceramic composite for light conversion according to the present invention may be processed into a suitable shape such as a plate. When the thickness of the ceramic composite for light conversion is changed, the color tone can be easily controlled when it is used in an emitting device, and when an accuracy of the shape is maintained, the variance in the color tone can be easily suppressed.

[Method for Producing Ceramic Composite for Light Conversion]

The ceramic composite for light conversion according to the present invention can be produced by melting the starting oxides and solidifying the molten product by means of unidirectional solidification under pre-determined conditions. For example, the solidified body can be obtained in an easy method in which a molten product of starting oxides put in a crucible kept at a pre-determined temperature equal to or higher than the melting temperature (about 1820° C.) is coagulated by cooling (solidifying) by controlling a cooling speed. The unidirectional solidification is a process in which the optimum temperature gradient is given to a solid phase/liquid phase interface and the crystal growth is controlled in one direction, whereby solidification is performed. In the unidirectional solidification, a crystal phase included is in the state of a single crystal, and grows continuously.

As the starting oxide, ceramic composite materials previously disclosed by the present applicant, (JP 7-149597 A, JP 7-187893 A, JP 8-81257 A, JP 8-253389 A, JP 8-253390 A and JP 9-67194A, and US patent applications corresponding thereto (U.S. Pat. Nos. 5,569,547, 5,484,752 and 5,902,963)) may be used, so long as at least one of the oxide phases is a fluorescent substance phase, and it is a composition including, as a main component, a mixture of $Al_2O_3$, $Y_2O_3$ and $CeO_2$. The disclosure in these applications and patents is incorporated herein by reference.

It is not necessary that the Sr compound or Ba compound added is an oxide when it is a starting material, and it may be a compound capable of easily changing to an oxide during a pre-treatment for preparation of starting materials or a production of the starting molten product, such as carbonate. The addition amount of these elements is decided in terms of the oxides of these elements. In terms of the oxide of Sr or Ba, SrO or BaO is used. The Sr compound or Ba compound which is exist as an oxide during the production may specifically include $SrO$, $SrF_2$, $SrCl_2$, $SrCO_3$, $BaO$, $BaF_2$, $BaCl_2$, $BaCO_3$, and the like.

According to unidirectional solidification, a temperature drop gradient, which is provided in the solidify direction, and a moving speed in the solidifying direction are controlled. The temperature drop gradient is 40° C./cm or higher, preferably 50° C./cm or higher. This gradient suppress the formation of oxide phases other than the first phase and the second phase, and it effectively acts for introducing a pre-determined Sr or Ba into the first phase of the solidified body. When the temperature gradient is lower than 40° C./cm, the complex oxide phases other than the first phase and the second phase such as a $CeAlO_3$ phase, a $CeAl_{11}O_{19}$ phase, an $SrAl_{12}O_{19}$ phase and a $BaAl_{12}O_{19}$ phase, are formed in a high volume ratio; as a result, a total radiant flux, obtained from the white light emitting device, may be sometimes reduced, when the white light emitting device is configured from a blue light emitting element and the ceramic composite for light conversion according to the present invention. In addition, because the complex oxide phase described above contains Ce and Sr, or Ba, the amount of the Ce and Sr, or Ba contained in the first phase may be decreased. The moving speed is 20 mm/hour or less, preferably from 1 to 15 mm/hour. This speed can suppress the formation of oxide phases other than the first phase and the second phase, and it effectively acts for introducing a pre-determined Sr or Ba into the first phase of the solidified body. When the moving speed is more than 20 mm/hour, as the same as above, the complex oxide phases other than the first phase and the second phase such as a $CeAlO_3$ phase, a $CeAl_{11}O_{19}$ phase, an $SrAl_{12}O_{19}$ phase and a $BaAl_{12}O_{19}$ phase, are formed in a high volume ratio; as a result, a total radiant flux, obtained from the white light emitting device, may be sometimes reduced, when the white light emitting device is configured from a blue light emitting element and the ceramic composite for light conversion according to the present invention. In addition, because the above-mentioned complex oxide phases containing Ce and Sr, or Ba are formed in a high volume ratio, the amount of the Ce and Sr, or Ba contained in the first phase may be decreased.

The temperature drop gradient refers to a temperature difference per cm of a heating means which is arranged in a direction parallel to the solidifying direction at certain intervals, measured by a thermocouple, or the like, when unidirectional solidification is performed by, for example, moving a crucible in which the molten product is put, or pulling up or down the molten product.

The moving speed refers to a moving speed of a crucible in a direction parallel to the solidifying direction, when unidirectional solidification is performed by, for example, moving a crucible in which the molten product is put, or pulling up or down the molten product.

The unidirectional solidification under the conditions described above is preferable for the production of the solidified body, which is the ceramic composite for light conversion according to the present invention. If the first phase and the second phase are solidified in the state in which they coexist, solidified body, which is the ceramic composite for light conversion according to the present invention, can be produced even conditions different from those described above.

[Light Emitting Device]

The light emitting device according to the present invention includes a light emitting element and the ceramic composite for light conversion according to the present invention. The light emitting element is preferably a light emitting element which emits light having a peak at 420 to 500 nm. This is because the first phase (fluorescent substance phase) of the ceramic composite for light conversion is excited by this wavelength to obtain fluorescence. The wavelength has more preferably a peak at 440 to 480 nm. This is because an excitation efficiency of the first phase is high, and thus the fluorescence can be efficiently obtained, which is preferable for improving the efficiency of the light emitting device. The light emitting element may include, for example, a light emitting diode element, an element generating laser light, and the light emitting diode element is preferable, because it is small and inexpensive. As the light emitting diode element, a blue light emitting diode element is preferable.

As the ceramic composite for light conversion, a fluorescent ceramic composite for light conversion having a dominant wavelength at 560 to 570 nm is preferable. As the light emitting device, a white light emitting device is preferable.

The light emitting device according to the present invention utilizes light, which is emitted from the light emitting element and irradiated to the ceramic composite for light conversion, and transmits through the ceramic composite for light conversion, and fluorescence, which is obtained by subjecting light emitted from the light emitting element to wavelength conversion by the ceramic composite for light conversion.

Figure 1:
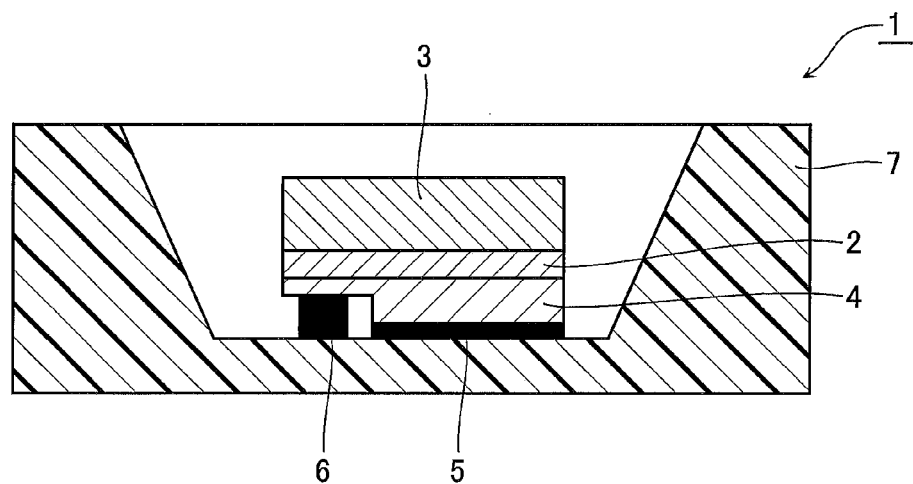
FIG. 1 is a schematic cross-sectional view showing an embodiment of a light-emitting device according to the present invention.

The light emitting device according to the present invention may be exemplified by a light emitting device 1 as shown in FIG. 1. The light emitting device 1 includes a fluorescent ceramic composite for light conversion 3, which has a dominant wavelength at 560 to 570 nm, and a light emitting element 4, which has a peak at 420 to 500 nm. The ceramic composite for light conversion 3 is formed into a tabular shape. A single crystal substrate 2 is arranged under the ceramic composite for light conversion 3 so that it is parallel to the ceramic composite for light conversion 3. The light emitting element 4 is formed on the single crystal substrate 2, and is connected to a package 7 through electrodes 5 and 6 on a surface different from the substrate side. The light emitting element 4 is an element emitting purple to blue light, and in order to obtain white based on its wavelength, after the purple to blue light, emitted from the light emitting element 4, transmit through the single crystal substrate 2, it enters the ceramic composite for light conversion 3, which has been subjected to adjustment of fluorescence peak wavelength. As a result, yellow fluorescence from the excited first phase (fluorescent substance phase) and purple to blue transmitted light from the second phase (non-fluorescent substance phase) passed through solidified body having a structure in which the first phase and the second phase are continuously and three-dimensionally intertwined with one another and homogeneously distributed, whereby lights are uniformly mixed, thus resulting in acquisition of white having small color unevenness.

As described above, in the ceramic composite for light conversion according to the present invention, the oxide phases including the fluorescent substance phase are continuously and three-dimensionally intertwined with one another in the single crystal state. Accordingly, from the ceramic composite for light conversion according to the present invention, homogeneous yellow fluorescence whose dominant wavelength is adjusted at 560 to 570 nm can be stably obtained in a high efficiency. In addition, the heat resistance and the durability are excellent, because it is configured by the oxide ceramic. Further, the ceramic composite for light conversion according to the present invention has a slightly amount of the phases other than the first phase (YAG:Ce phase) and the second phase ($Al_2O_3$ phase), which are low in continuity, and thus the light transmittance is high. When it is combined with the blue light emitting element to configure the white light emitting device, accordingly, the total radiant flux of the white light is not reduced regardless of the fluorescence wavelength.

As the light emitting device according to the present invention includes the ceramic composite for light conversion according to the present invention, when it is combined with the blue light emitting element, due to the homogeneous yellow fluorescence which has been subjected to wavelength adjustment, the white light emitting device, which has no variance of the emission wavelength due to the light emitting device, is homogeneous, and has the small color unevenness and the high brightness, can be obtained. In addition, because the light emitting device according to the present invention includes the ceramic composite for light conversion according to the present invention, the ceramic composite for light conversion itself is a bulk body and thus the sealing resin is not necessary, as a result, the deterioration due to heat or light does not occur, and it is possible to increase the output and improve the efficiency.

EXAMPLES

The present invention will be explained in more detail showing concrete examples below.

Example 1

An $\alpha$-$Al_2O_3$ powder (purity: 99.99%), a $Y_2O_3$ powder (purity: 99.9%), and a $CeO_2$ powder (purity: 99.9%) were weighed respectively so as to provide 0.81 mol in terms of $AlO_{3/2}$, 0.19×0.997 mol in terms of $YO_{3/2}$, and 0.19×0.003 mol. An $SrCO_3$ powder (purity: 99.9%) was weighed so as to provide 0.3 parts by mass in terms of the oxide base on the 100 parts by mass of the mixture thereof. These powders were subjected to wet mixing in ethanol for 16 hours in a ball mill, and then the ethanol as a solvent was removed therefrom using an evaporator to obtain a starting material powder. The starting material powder was pre-molten in a vacuum furnace to obtain a starting material for unidirectional solidification.

Next, this starting material was directly put in a molybdenum crucible, the molybdenum crucible was set in a melting holding zone of an unidirectional solidification apparatus provided with the melting holding zone in an upper section and a cooling zone with a temperature gradient of 100° C./cm set in the vertical direction (solidification direction) in a lower section, and the starting material was molten under the pressure of $1.33 \times 10^{-3}$ Pa($10^{-5}$ Torr). Next, in the same atmosphere, the molybdenum crucible was lowered at a speed of 5 mm/hour to cool the molybdenum crucible from the bottom to obtain a solidified body according to Example 1, including a YAG:Ce phase and an $Al_2O_3$ phase.

A cross-sectional structure in a direction perpendicular to the solidifying direction of the solidified body is shown in FIG. 2, wherein a black section A shows the second phase ($Al_2O_3$ phase), and a white section B shows the first phase (YAG:Ce phase).

The fluorescence dominant wavelength (nm), the variation of the dominant wavelength at each position, and the fluorescence intensity were determined for the thus obtained solidified body as follows. The results are shown in Table 1.

Fluorescence Dominant Wavelength, Variation of Same and Fluorescence Intensity:

The sizes of the solidified body, which was the ceramic composite for light conversion, were a diameter of 40 mm, and a height (in the solidifying direction) of 70 mm. Disk samples having a size of $\phi$16 mm×0.2 mm were cut from the obtained solidified body at each position in the solidifying direction. The positions at which the samples were cut were positions at which the product was divided into 5 parts in the solidifying direction of the obtained solidified body including the both ends, and the center of the disk sample was set at a position of the center of a surface perpendicular to the solidifying direction of the solidified body. The fluorescence property was evaluated for each of the disk samples at the 5 positions using a solid quantum efficiency measuring apparatus manufactured by JASCO Corporation, the wavelength of the excitation light being set at 460 nm. An average value ($\lambda_{d, ave}$) of the fluorescence dominant wavelength was obtained from the five samples obtained from the same solidified body and the different positions, and from the difference between the average value and the dominant wavelength of the sample ($\lambda_d$) at the cut position, a variation of the dominant wavelength $\Delta\lambda_d$(nm) ($=\lambda_d-\lambda_{d, ave}$) was calculated. The absolute value of the maximum value $|\lambda_{d, max}|$ was used as an indicator of the dominant wavelength variance.

As for the fluorescence intensity, the maximum fluorescence intensity in Comparative Example 1, described below, was shown as 1. Comparing with Comparative Example 1, it was found that the fluorescence dominant wavelength did not move, and the same fluorescence intensity was obtained. In addition, the maximum variation of the dominant wavelength $|\Delta\lambda_{d,\,max}|$ at each position of the solidified body was 0.1 nm or less to the average value of the dominant wavelength of the sample.

Light Emitting Device:

A light emitting device 1 as shown in FIG. 1 was made. As the ceramic composite for light conversion 3, a tabular shape sample having a size of 2 mm×1 mm×0.1 to 0.8 mm, obtained from the solidified body, was used. As the light emitting element 4, an LED, which can emit blue light with a wavelength of 463 nm, was used. Light is emitted from the LED, the blue light was irradiated to the bottom surface of the tabular shape sample, and the radiant flux radiated was measured using a commercially available LED measurement system using an integrating sphere. It was confirmed that the radiant flux measured showed a value reflecting the fluorescence property of the ceramic composite for light conversion. The light emitting device of the present invention, therefore, showed the fluorescence of the designed color tone, the small color unevenness or variance, and the high brightness. From a change in the fluorescence chromaticity obtained when the sample thickness of the ceramic composite for light conversion was changed, the adaptability in the stabilization of the color tone of the light emitting device caused by the thickness adjustment of the ceramic composite for light conversion was evaluated.

Comparative Example 1

As the starting material, an $\alpha$-$Al_2O_3$ powder (purity: 99.99%), a $Y_2O_3$ powder (purity: 99.9%), and a $CeO_2$ powder (purity: 99.9%) were weighed respectively so as to provide 0.81 mol in terms of $AlO_{3/2}$, 0.19×0.997 mol in terms of $YO_{3/2}$, and 0.19×0.003 mol, and other compounds were not added. A solidified body according to Comparative Example 1 was obtained in the same process as in Example 1. Comparative Example 1 was therefore an example containing no Sr oxide. The fluorescence dominant wavelength (nm), the maximum variation obtained from the average value of the dominant wavelength and the fluorescence intensity were determined for the obtained solidified body in the same manner as in Example 1. The results are shown in Table 1.

Figure 3:
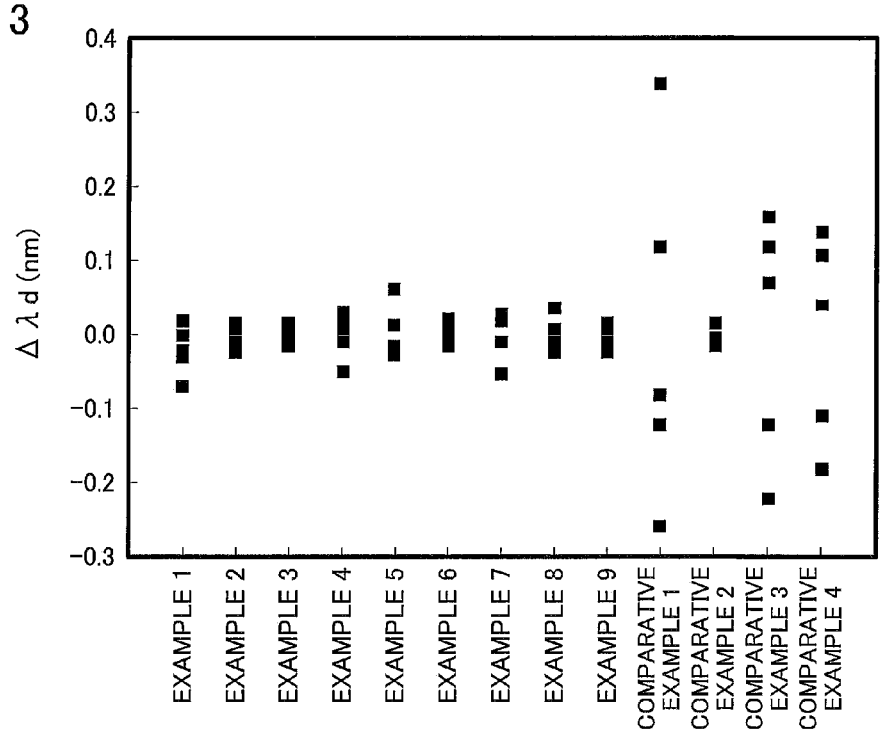
FIG. 3 is a graph showing variances in the fluorescence dominant wavelength of ceramic composites for light conversion according to Examples and Comparative Examples.

FIG. 3 is a graph comparing ranges of the difference between the average value of the dominant wavelength and the dominant wavelength at each position in the solidifying direction, for the ceramic composite for light conversion according to Example and Comparative Example. As shown in FIG. 3, in Comparative Example 1, there was a difference of ±3 nm or more to the average value of the dominant wavelength of the sample, depending on the cut position in the solidifying direction, whereas in Example 1, the difference was 0.1 nm or less to the average value of the dominant wavelength of the sample. This value shows that the property variance was greatly improved at the position in the solidifying direction.

Example 2

As the starting material, an $\alpha$-$Al_2O_3$ powder (purity: 99.99%), a $Y_2O_3$ powder (purity: 99.9%), and a $CeO_2$ powder (purity: 99.9%) were weighed respectively so as to provide 0.81 mol in terms of $AlO_{3/2}$, 0.19×0.993 mol in terms of $YO_{3/2}$, and 0.19×0.007 mol. A $SrCO_3$ powder (purity: 99.9%) was weighed so as to provide 0.3 parts by mass in terms of the oxide base on the 100 parts by mass of the mixture thereof. Other than the above, a solidified body according to Example 2 was obtained in the same process as in Example 1, except that the moving speed of the molybdenum crucible was set at 10 mm/hour.

The fluorescence dominant wavelength (nm), the maximum variation obtained from the average value of the dominant wavelength and the fluorescence intensity were determined for the obtained solidified body in the same manner as in Example 1. The results are shown in Table 1. The variations of the dominant wavelength in the solidifying direction were 0.1 nm or less to the average value of the dominant wavelength of the sample, as the same as in Example 1.

Example 3

As the starting material, an $\alpha$-$Al_2O_3$ powder (purity: 99.99%), a $Y_2O_3$ powder (purity: 99.9%), and a $CeO_2$ powder (purity: 99.9%) were weighed respectively so as to provide 0.81 mol in terms of $AlO_{3/2}$, 0.19×0.996 mol in terms of $YO_{3/2}$, and 0.19×0.004 mol. A $SrCO_3$ powder (purity: 99.9%) was weighed so as to provide 0.4 parts by mass in terms of the oxide base on the 100 parts by mass of the mixture thereof. Other than the above, a solidified body according to Example 3 was obtained in the same process as in Example 1, except that the moving speed of the molybdenum crucible was set at 10 mm/hour.

The fluorescence dominant wavelength (nm), the maximum variation obtained from the average value of the dominant wavelength and the fluorescence intensity were determined for the obtained solidified body in the same manner as in Example 1. The results are shown in Table 1. The variations of the dominant wavelength in the solidifying direction were 0.1 nm or less to the average value of the dominant wavelength of the sample, as the same as in Example 1.

Example 4

As the starting material, an $\alpha$-$Al_2O_3$ powder (purity: 99.99%), a $Y_2O_3$ powder (purity: 99.9%), and a $CeO_2$ powder (purity: 99.9%) were weighed respectively so as to provide 0.81 mol in terms of $AlO_{3/2}$, 0.19×0.996 mol in terms of $YO_{3/2}$, and 0.19×0.004 mol. A $SrCO_3$ powder (purity: 99.9%) was weighed so as to provide 0.1 parts by mass in terms of the oxide base on the 100 parts by mass of the mixture thereof. Other than the above, a solidified body according to Example 4 was obtained in the same process as in Example 1, except that the moving speed of the molybdenum crucible was set at 10 mm/hour.

The fluorescence dominant wavelength (nm), the maximum variation obtained from the average value of the dominant wavelength and the fluorescence intensity were determined for the obtained solidified body in the same manner as in Example 1. The results are shown in Table 1. The variations of the dominant wavelength in the solidifying direction were 0.1 nm or less to the average value of the dominant wavelength of the sample, as the same as in Example 1.

Comparative Example 2

As the starting material, an $\alpha$-$Al_2O_3$ powder (purity: 99.99%), a $Y_2O_3$ powder (purity: 99.9%), and a $CeO_2$ powder (purity: 99.9%) were weighed respectively so as to provide 0.81 mol in terms of $AlO_{3/2}$, 0.19×0.997 mol in terms of $YO_{3/2}$, and 0.19×0.003 mol. A $SrCO_3$ powder (purity: 99.9%) was weighed so as to provide 1.1 parts by mass in terms of the oxide base on the 100 parts by mass of the mixture thereof.

Other than the above, a solidified body according to Comparative Example 2 was obtained in the same process as in Example 1. Comparative Example 2 was an example in which the amount of the Sr oxide was increased.

The fluorescence dominant wavelength (nm), the maximum variation obtained from the average value of the dominant wavelength and the fluorescence intensity were determined for the obtained solidified body in the same manner as in Example 1. The results are shown in Table 1. The variations of the dominant wavelength in the solidifying direction were 0.1 nm or less to the average value of the dominant wavelength of the sample, as the same as in Example 1, but the fluorescence intensity was reduced compared to Comparative Example 1.

Figure 4:
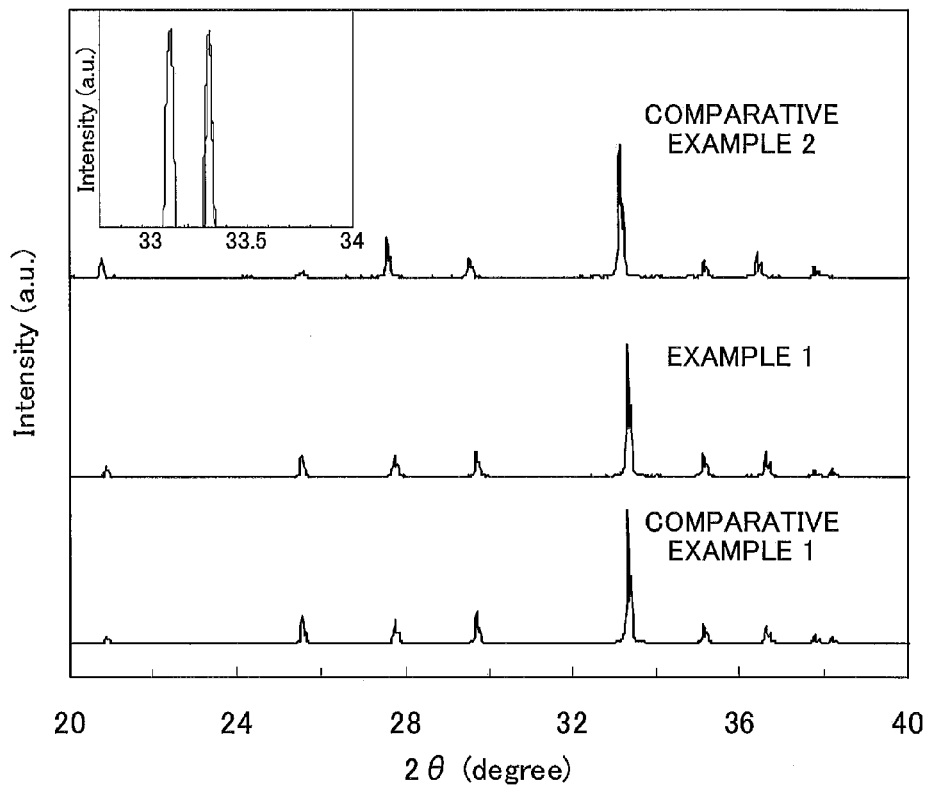
FIG. 4 is an X-ray diffraction diagram showing ceramic composites for light conversion according to Example 1, Comparative Example 1 and Comparative Example 2.

FIG. 4 shows a comparison of an X-ray diffraction pattern of the powder obtained by pulverizing the solidified body from Example 1 to those of the powders obtained by pulverizing the solidified bodies from Comparative Examples 1 and 2. All had peaks of the YAG phase and the peak of the $Al_2O_3$ phase, but in Comparative Example 2 in which the addition amount of Sr in terms of the oxide was large, the peak of the YAG phase shifted to the low-angle side. From an enlarged view of the peak of YAG (420), shown at the upper left of the graph, it was found that the peak of the YAG phase shifted to the low-angle side in Example 1, too. These show that lattices of YAG were expanded by the increased addition amount of the Sr in terms of the oxide, and it was found that Sr existed in the YAG phase.

As for the solidified bodies from Example 1 and Comparative Example 2, an elementary analysis was performed on the cross-section in the state of a mirror surface using an electron emission type scanning electron microscope. In backscattered electron images taken on the elementary analysis, the first phase (YAG:Ce phase) and the second phase ($Al_2O_3$ phase) could be clearly distinguished from each other by the difference in the brightness of white and black. At the same time, a constituent element mapping drawing was obtained in the same view as the backscattered electron image, from the elementary analysis. As a result, the distribution region of the Sr element was consistent with a region which was identified as the first phase by the backscattered electron images and the Y element distribution region. These showed that Sr existed in the YAG phase.

Example 5

As the starting material, an $\alpha$-$Al_2O_3$ powder (purity: 99.99%), a $Y_2O_3$ powder (purity: 99.9%), and a $CeO_2$ powder (purity: 99.9%) were weighed respectively so as to provide 0.81 mol in terms of $AlO_{3/2}$, 0.19×0.99 mol in terms of $YO_{3/2}$, and 0.19×0.01 mol. A $SrCO_3$ powder (purity: 99.9%) was weighed so as to provide 0.3 parts by mass in terms of the oxide base on the 100 parts by mass of the mixture thereof. Other than the above, a solidified body according to Example 5 was obtained in the same process as in Example 1.

The fluorescence dominant wavelength (nm), the maximum variation obtained from the average value of the dominant wavelength and the fluorescence intensity were determined for the obtained solidified body in the same manner as in Example 1. The results are shown in Table 1. The fluorescence intensity showed a higher value such as 1.4, than that in Comparative Example 1, but the same value as in Example 1 could be kept for the fluorescence dominant wavelength. In addition, the variations of the dominant wavelength in the solidifying direction were 0.1 nm or less to the average value of the dominant wavelength of the sample, as the same as in Example 1.

Comparative Example 3

As the starting material, an $\alpha$-$Al_2O_3$ powder (purity: 99.99%), a $Y_2O_3$ powder (purity: 99.9%), and a $CeO_2$ powder (purity: 99.9%) were weighed respectively so as to provide 0.81 mol in terms of $AlO_{3/2}$, 0.19×0.99 mol in terms of $YO_{3/2}$, and 0.19×0.01 mol, and other compounds were not added. A solidified body according to Comparative Example 3 was obtained in the same process as in Example 1. Comparative Example 3 was, therefore, an example in which the Sr oxide was not included in Example 5.

The fluorescence dominant wavelength (nm), the maximum variation obtained from the average value of the dominant wavelength and the fluorescence intensity were determined for the obtained solidified body in the same manner as in Example 1. The results are shown in Table 1. The fluorescence intensity showed a higher value such as 1.4, than that in Comparative Example 1, but the fluorescence dominant wavelength was longer than the wavelength in Example 1. In addition, the variations of the dominant wavelength in the solidifying direction were 0.2 nm to the average value of the dominant wavelength of the sample.

Figure 5:
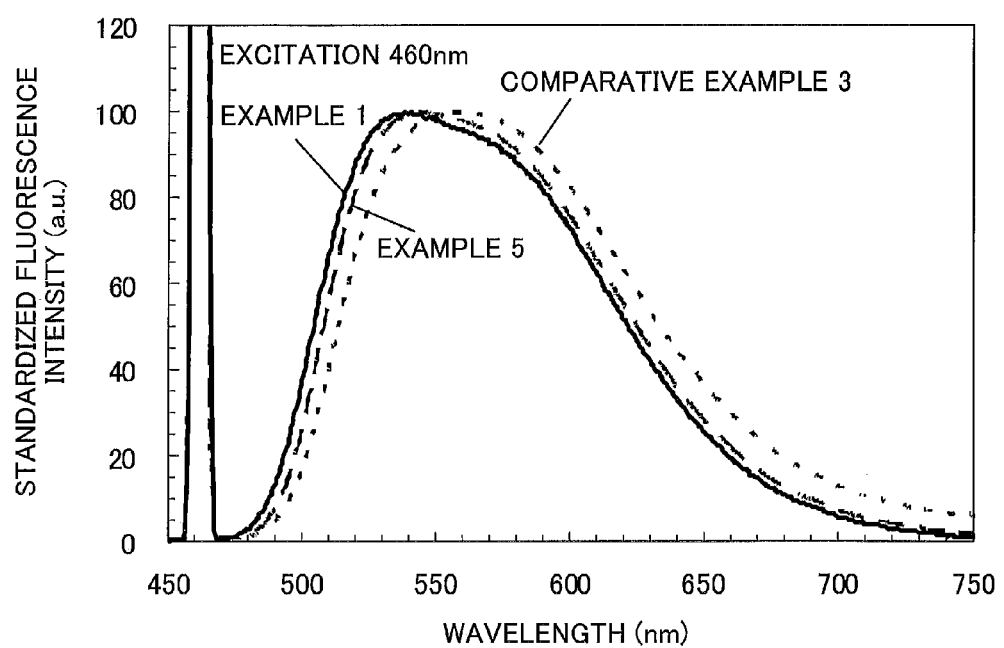
FIG. 5 is a spectrography showing fluorescence properties of ceramic composites for light conversion according to Example 1, Example 5 and Comparative Example 3.

FIG. 5 is a spectrography showing the fluorescence properties of the ceramic composite for light conversions according to Example 1, Example 5 and Comparative Example 3. In Example 5, the fluorescence spectrum showing the same dominant wavelength as in Example 1 was obtained, whereas in Comparative Example 3, it was shown that the fluorescence spectrum shifted to the long wavelength side, though the Ce amount was the same as in Example 5.

Example 6

As the starting material, an $\alpha$-$Al_2O_3$ powder (purity: 99.99%), a $Y_2O_3$ powder (purity: 99.9%), and a $CeO_2$ powder (purity: 99.9%) were weighed respectively so as to provide 0.81 mol in terms of $AlO_{3/2}$, 0.19×0.97 mol in terms of $YO_{3/2}$, and 0.19×0.03 mol. A $SrCO_3$ powder (purity: 99.9%) was weighed so as to provide 0.3 parts by mass in terms of the oxide base on the 100 parts by mass of the mixture thereof. Other than the above, a solidified body according to Example 6 was obtained in the same process as in Example 1.

The fluorescence dominant wavelength (nm), the maximum variation obtained from the average value of the dominant wavelength and the fluorescence intensity were determined for the obtained solidified body in the same manner as in Example 1. The results are shown in Table 1. The fluorescence intensity showed a higher value such as 1.5, than that in Comparative Example 1, but the fluorescence dominant wavelength was almost the same as in Example 1. In addition, the variations of the dominant wavelength in the solidifying direction were 0.1 nm or less to the average value of the dominant wavelength of the sample, as the same as in Example 1.

Example 7

As the starting material, an $\alpha$-$Al_2O_3$ powder (purity: 99.99%), a $Y_2O_3$ powder (purity: 99.9%), and a $CeO_2$ powder (purity: 99.9%) were weighed respectively so as to provide 0.81 mol in terms of $AlO_{3/2}$, 0.19×0.97 mol in terms of $YO_{3/2}$, and 0.19×0.03 mol. A $SrCO_3$ powder (purity: 99.9%) was weighed so as to provide 0.8 parts by mass in terms of the oxide base on the 100 parts by mass of the mixture thereof. Other than the above, a solidified body according to Example 7 was obtained in the same process as in Example 1.

The fluorescence dominant wavelength (nm), the maximum variation obtained from the average value of the dominant wavelength and the fluorescence intensity were determined for the obtained solidified body in the same manner as in Example 1. The results are shown in Table 1. The fluorescence intensity showed a higher value such as 1.6, than that in Comparative Example 1, but the fluorescence dominant wavelength was almost the same as in Example 1. In addition, the variations of the dominant wavelength in the solidifying direction were 0.1 nm or less to the average value of the dominant wavelength of the sample, as the same as in Example 1.

Comparative Example 4

As the starting material, an α-$Al_2O_3$ powder (purity: 99.99%), a $Y_2O_3$ powder (purity: 99.9%), and a $CeO_2$ powder (purity: 99.9%) were weighed respectively so as to provide 0.81 mol in terms of $AlO_{3/2}$, 0.19×0.97 mol in terms of $YO_{3/2}$, and 0.19×0.03 mol, and other compounds were not added. A solidified body according to Comparative Example 4 was obtained in the same process as in Example 1. Comparative Example 4 was, therefore, an example in which the Ce atomic ratio was high and the Sr oxide was not included.

The fluorescence dominant wavelength (nm), the maximum variation obtained from the average value of the dominant wavelength and the fluorescence intensity were determined for the obtained solidified body in the same manner as in Example 1. The results are shown in Table 1. The fluorescence intensity showed a higher value such as 1.5, than that in Comparative Example 1, but the fluorescence dominant wavelength was even longer than that in Comparative Example 3. In addition, the variations of the dominant wavelength in the solidifying direction were 0.2 nm to the average value of the dominant wavelength of the sample.

Example 8

As the starting material, an α-$Al_2O_3$ powder (purity: 99.99%), a $Y_2O_3$ powder (purity: 99.9%), and a $CeO_2$ powder (purity: 99.9%) were weighed respectively so as to provide 0.81 mol in terms of $AlO_{3/2}$, 0.19×0.997 mol in terms of $YO_{3/2}$, and 0.19×0.003 mol. A $BaCO_3$ powder (purity: 99.9%) was weighed so as to provide 0.3 parts by mass in terms of the oxide base on the 100 parts by mass of the mixture thereof. Other than the above, a solidified body according to Example 8 was obtained in the same process as in Example 1. Example 8 was, therefore, an example in which Sr was changed to Ba in Example 1.

The fluorescence dominant wavelength (nm), the maximum variation obtained from the average value of the dominant wavelength and the fluorescence intensity were determined for the obtained solidified body in the same manner as in Example 1. The results are shown in Table 1. The fluorescence intensity showed the similar value to that in Example 1, and the fluorescence dominant wavelength was kept at almost the same as in Example 1. The variations of the dominant wavelength in the solidifying direction were 0.1 nm or less to the average value of the dominant wavelength of the sample, as the same as in Example 1.

Comparative Example 5

As the starting material, an α-$Al_2O_3$ powder (purity: 99.99%), a $Y_2O_3$ powder (purity: 99.9%), and a $CeO_2$ powder (purity: 99.9%) were weighed respectively so as to provide 0.81 mol in terms of $AlO_{3/2}$, 0.19×0.997 mol in terms of $YO_{3/2}$, and 0.19×0.003 mol. A $CaCO_3$ powder (purity: 99.9%) was weighed so as to provide 0.3 parts by mass in terms of the oxide base on the 100 parts by mass of the mixture thereof. Other than the above, a solidified body according to Comparative Example 5 was obtained in the same process as in Example 1. Comparative Example 5 was, therefore, an example in which Sr was changed to Ca in Example 1. The obtained solidified body showed the same structure as in Example 1, but the fluorescence intensity in the light emitting device of Comparative Example 5 was 1% or lower than that in Example 1, and the fluorescence property was remarkably reduced.

Example 9

As the starting material, an α-$Al_2O_3$ powder (purity: 99.99%), a $Y_2O_3$ powder (purity: 99.9%), and a $CeO_2$ powder (purity: 99.9%) were weighed respectively so as to provide 0.81 mol in terms of $AlO_{3/2}$, 0.19×0.96 mol in terms of $YO_{3/2}$, and 0.19×0.04 mol. A $SrCO_3$ powder (purity: 99.9%) was weighed so as to provide 0.3 parts by mass in terms of the oxide base on the 100 parts by mass of the mixture thereof. Other than the above, a solidified body according to Example 9 was obtained in the same process as in Example 1.

The fluorescence dominant wavelength (nm), the maximum variation obtained from the average value of the dominant wavelength and the fluorescence intensity were determined for the obtained solidified body in the same manner as in Example 1. The results are shown in Table 1. The fluorescence intensity showed a higher value such as 1.5, than that in Comparative Example 1, but the fluorescence dominant wavelength was almost the same as in Example 1. In addition, the variations of the dominant wavelength in the solidifying direction were 0.1 nm or less to the average value of the dominant wavelength of the sample, as the same as in Example 1.

However, the solidified body in Example 9 had an increased volume percent of the complex oxide phases other than the first phase and the second phase, such as the $CeAlO_3$ phase and the $CeAl_{11}O_{18}$ phase, and the further improvement of the fluorescence intensity, obtained by the increase of the Ce amount, sometimes might not be seen. When the white light emitting device was configured from the blue light emitting element and the ceramic composite for light conversion according to the present invention, the thickness of the sample, from which the appropriate pseudo white could be obtained, was thin, such as 0.09 mm, because of the larger percent of the yellow fluorescence than blue. As a result, the severe thickness accuracy was required in order to obtain the light emitting device showing the stable color tone.

TABLE 1

| | Ce atomic ratio Ce/(Y + Ce) | Metal element of oxide added | Addition amount in terms of oxide (parts by mass) | Fluorescence dominant wavelength $\lambda_d$(nm) | Maximum variation of the dominant wavelength $|\lambda_{d,max}|$ | Fluorescence intensity (the value in Comparative Example 1 is 1) |
|---|---|---|---|---|---|---|
| Example 1 | 0.003 | Sr | 0.3 | 567 | <0.1 | 1.0 |
| Example 2 | 0.007 | Sr | 0.3 | 568 | <0.1 | 1.3 |

TABLE 1-continued

|  | Ce atomic ratio Ce/(Y + Ce) | Metal element of oxide added | Addition amount in terms of oxide (parts by mass) | Fluorescence dominant wavelength $\lambda_d$(nm) | Maximum variation of the dominant wavelength $|\lambda_{d, max}|$ | Fluorescence intensity (the value in Comparative Example 1 is 1) |
|---|---|---|---|---|---|---|
| Example 3 | 0.004 | Sr | 0.4 | 567 | <0.1 | 1.1 |
| Example 4 | 0.004 | Sr | 0.1 | 568 | <0.1 | 1.2 |
| Example 5 | 0.01 | Sr | 0.3 | 567 | <0.1 | 1.4 |
| Example 6 | 0.03 | Sr | 0.3 | 569 | <0.1 | 1.5 |
| Example 7 | 0.03 | Sr | 0.8 | 569 | <0.1 | 1.6 |
| Example 8 | 0.003 | Ba | 0.3 | 569 | <0.1 | 1.0 |
| Example 9 | 0.04 | Sr | 0.3 | 569 | <0.1 | 1.5 |
| Comparative Example 1 | 0.003 | — | 0 | 568 | 0.3 | 1.0 |
| Comparative Example 2 | 0.003 | Sr | 1.1 | 567 | <0.1 | 0.9 |
| Comparative Example 3 | 0.01 | — | 0 | 571 | 0.2 | 1.4 |
| Comparative Example 4 | 0.03 | — | 0 | 572 | 0.2 | 1.5 |
| Comparative Example 5 | 0.003 | Ca | 0.3 | 565 | — | <0.01 |

REFERENCE SIGNS LIST

1 light emitting device
2 single crystal substrate
3 ceramic composite for light conversion
4 light emitting element (light emitting diode element)
5, 6 electrode
7 package

The invention claimed is:

1. A ceramic composite for light conversion, which is a solidified body and comprises at least two oxide phases including a first phase and a second phase which are continuously and three-dimensionally intertwined with one another,
the first phase containing Ba or Sr, and being a $Y_3Al_5O_{12}$ phase activated with fluorescent Ce,
the second phase being an $Al_2O_3$ phase, and
the Sr or Ba in the solidified body being contained in an amount of 0.01 to 1.00 part by mass based on 100 parts by mass of the solidified body, in terms of the oxide.

2. The ceramic composite for light conversion according to claim 1, wherein a content of the cerium in the solidified body, when expressed it by Ce/(Y+Ce), is less than 0.04 (excluding 0).

3. The ceramic composite for light conversion according to claim 2, which absorbs light having a peak at wavelength of 420 to 500 nm to emit fluorescence having a dominant wavelength at 560 to 570 nm.

4. The ceramic composite for light conversion according to claim 1, which absorbs light having a peak at wavelength of 420 to 500 nm to emit fluorescence having a dominant wavelength at 560 to 570 nm.

5. A light emitting device comprising:
a light emitting element; and
a ceramic composite for light conversion according to claim 1.

6. The light emitting device according to claim 5, wherein the light emitting element having a peak at a wavelength of 420 to 500 nm; and
the ceramic composite for light conversion emits fluorescence having a dominant wavelength at 560 to 570 nm.

7. The light emitting device according to claim 6, wherein the light emitting element is a light emitting diode element.

8. The light emitting device according to claim 5, wherein the light emitting element is a light emitting diode element.

9. A method of producing a ceramic composition for light conversion according to claim 1 comprising:
melting a starting mixture including an Sr compound or a Ba compound, which exists as an oxide during the production, in an amount of 0.01 to 1 part by mass based on 100 parts by mass of a mixture of $Al_2O_3$, $Y_2O_3$ and $CeO_2$, in terms of the oxide; and
solidifying the molten mixture by means of unidirectional solidification.

* * * * *